US012740199B2

(12) United States Patent
Deng

(10) Patent No.: US 12,740,199 B2
(45) Date of Patent: Sep. 15, 2026

(54) ANTIOXIDANTS, BACKLIGHT MODULES AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Hongzhao Deng, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 404 days.

(21) Appl. No.: 18/383,652

(22) Filed: Oct. 25, 2023

(65) Prior Publication Data

US 2025/0006867 A1 Jan. 2, 2025

(30) Foreign Application Priority Data

Jun. 30, 2023 (CN) ......................... 202310804709.6

(51) Int. Cl.

| | |
|---|---|
| ***H10H 20/84*** | (2025.01) |
| ***C09D 7/20*** | (2018.01) |
| ***C09D 7/61*** | (2018.01) |
| ***C09D 7/65*** | (2018.01) |
| ***C09D 133/08*** | (2006.01) |

(Continued)

(52) U.S. Cl.

CPC ............... *H10H 20/84* (2025.01); *C09D 7/20* (2018.01); *C09D 7/61* (2018.01); *C09D 7/65* (2018.01); *C09D 133/08* (2013.01); *H10H 20/857* (2025.01); *H10H 29/142* (2025.01); *H10H 20/034* (2025.01); *H10H 20/0364* (2025.01)

(58) Field of Classification Search
None
See application file for complete search history.

(56) References Cited

U.S. PATENT DOCUMENTS

2018/0039013 A1* 2/2018 Yanai ................ G02F 1/133615
2018/0051144 A1* 2/2018 Kwon ...................... G02B 1/04
(Continued)

FOREIGN PATENT DOCUMENTS

CN 102942817 A 2/2013
CN 107365521 A 11/2017
(Continued)

OTHER PUBLICATIONS

Chinese Office Action issued in corresponding Chinese Patent Application No. 202310804709.6 dated Jan. 17, 2025, pp. 1-8, 16pp.

*Primary Examiner* — Christopher E Dunay
(74) *Attorney, Agent, or Firm* — The Roy Gross Law Firm, LLC; Roy D. Gross

(57) ABSTRACT

Disclosed are an antioxidant, a backlight module and a manufacturing method thereof. The antioxidant includes a film-forming component and a volatilization-suppressing additive. The film-forming component includes at least one of a substituted or unsubstituted acrylic resin, isopropanolamine, and imidazoline, and a boiling point of the volatilization-suppressing additive is greater than that of the film-forming component.

8 Claims, 2 Drawing Sheets

(51) Int. Cl.

| | |
|---|---|
| ***H10H 20/857*** | (2025.01) |
| ***H10H 29/14*** | (2025.01) |
| *H10H 20/01* | (2025.01) |

(56) References Cited

U.S. PATENT DOCUMENTS

| | | | | |
|---|---|---|---|---|
| 2018/0051188 | A1* | 2/2018 | Nagata | C09J 7/385 |
| 2018/0157125 | A1* | 6/2018 | Yasui | B32B 27/30 |
| 2018/0169996 | A1* | 6/2018 | Wolk | B32B 27/12 |
| 2018/0203293 | A1* | 7/2018 | Lee | G02F 1/133528 |

FOREIGN PATENT DOCUMENTS

| | | | |
|---|---|---|---|
| CN | 111335041 | A | 6/2020 |
| CN | 113249034 | A | 8/2021 |
| CN | 113402245 | A | 9/2021 |
| CN | 113737167 | A | 12/2021 |

* cited by examiner

ANTIOXIDANTS, BACKLIGHT MODULES AND MANUFACTURING METHOD THEREOF

CROSS-REFERENCE TO RELATED APPLICATIONS

This application claims priority to Chinese Patent Application No. 202310804709.6, filed on Jun. 30, 2023, the contents of which are incorporated herein by reference in its entirety.

TECHNICAL FIELD

The present disclosure relates to the field of display, and more particularly, to an antioxidant, a backlight module, and a manufacturing method thereof.

BACKGROUND

Mini light emitting diodes (Mini LEDs) are regarded by many manufacturers as a new technology for next generation displays, and have advantages of far less power consumption than liquid crystal displays (LCDs) and better brightness than organic light-emitting diode displays (OLEDs).

In the existing process of manufacturing the Mini LED backlight module, it is necessary to coat an antioxidant on a terminal soldered to the LED to avoid oxidation of the terminal during the manufacturing process, which affects the connection of the terminal. When a conventional antioxidant is coated to a binding terminal used for binding a drive assembly, the binding terminal cannot be bound to the drive assembly. Therefore, no antioxidant is coated to the binding terminal in the related art, resulting in the binding terminal being prone to be oxidized in the manufacturing process, for example, a high-temperature manufacturing process, which affects the binding effect.

SUMMARY

Embodiments of the present disclosure provide an antioxidant, a backlight module, and a manufacturing method thereof, which can slow the volatilization rate of the antioxidant.

Embodiments of the present disclosure provide an antioxidant, including a film-forming component and a volatilization-suppressing additive, wherein the film-forming component includes at least one of a substituted or unsubstituted acrylic resin, isopropanolamine, and imidazoline, and a boiling point of the volatilization-suppressing additive is greater than that of the film-forming component.

In an embodiment of the present disclosure, the volatilization-suppressing additive includes a lead-containing complex and/or a liquid paraffin wax.

In an embodiment of the present disclosure, the antioxidant further includes a solvent, the solvent includes an alcohol solvent, and the volatilization-suppressing additive further includes calcium chloride.

In an embodiment of the present disclosure, the boiling point of the film-forming component is less than or equal to 200° C.

In an embodiment of the present disclosure, a mass content of the film-forming component in the antioxidant is 40% to 50%, and a mass content of the volatilization-suppressing additive in the antioxidant is 11% to 19%.

Embodiments of the present disclosure further provides a method of manufacturing a backlight module, wherein the backlight module includes an antioxidant, and the antioxidant includes a film-forming component and a volatilization-suppressing additive, the film-forming component includes at least one of a substituted or unsubstituted acrylic resin, isopropanolamine, and imidazoline, and a boiling point of the volatilization-suppressing additive is greater than that of the film-forming component, and the method includes the following steps of:

forming one or more first terminals and one or more second terminals on a substrate;

coating the antioxidant to the first terminals and the second terminals to form a first protective film on each of the first terminals and a second protective film on each of the second terminals;

connecting a light-emitting member to the first terminals, and removing the second protective film; and connecting a drive assembly to the second terminals.

In an embodiment of the present disclosure, the step of connecting the light-emitting member to the first terminals and removing the second protective film includes:

soldering the light-emitting member to the first terminals, removing the first protective film and the second protective film, and electrically connecting the light-emitting member to the first terminals, wherein a rate of removal of the second protective film is less than that of the first protective film.

In an embodiment of the present disclosure, in the step of soldering the light-emitting member to the first terminals and removing the first protective film and the second protective film:

a boiling point of the volatilization-suppressing additive in the second protective film is greater than or equal to a first temperature, and the first temperature is a soldering temperature of the light-emitting member.

Embodiments of the present disclosure further provides a backlight module including a substrate and one or more first terminals and one or more second terminals formed on the substrate, wherein an antioxidant is coated on the first terminals and the second terminals, and the antioxidant includes a film-forming component and a volatilization-suppressing additive, the film-forming component includes at least one of a substituted or unsubstituted acrylic resin, isopropanolamine, and imidazoline, and a boiling point of the volatilization-suppressing additive is greater than that of the film-forming component.

In an embodiment of the present disclosure, the volatilization-suppressing additive includes a lead-containing complex and/or a liquid paraffin wax.

In an embodiment of the present disclosure, the antioxidant further includes a solvent, wherein the solvent includes an alcohol solvent, and the volatilization-suppressing additive further includes calcium chloride.

In an embodiment of the present disclosure, the boiling point of the film-forming component is less than or equal to 200° C.

In an embodiment of the present disclosure, a mass content of the film-forming component in the antioxidant is 40% to 50%, and a mass content of the volatilization-suppressing additive in the antioxidant is 11% to 19%.

In an embodiment of the present disclosure, a surface of each of the first terminals and/or a surface of each of the second terminals contains at least one of a co-soluble alloy of $Pb^{2+}$, Pb, $Al^{3+}$, $Pb^{2+}$ with a terminal metal, a carboxyl group, and a carbon-carbon double bond, and a material of the first terminals and a material of the second terminals include the terminal metal.

In an embodiment of the present disclosure, the backlight module further includes a light-emitting member and a drive assembly, wherein the first terminals are electrically connected to the light-emitting member, and the second terminals are bound to the drive assembly.

In an embodiment of the present disclosure, the light-emitting member includes an LED light member.

BRIEF DESCRIPTION OF THE DRAWINGS

Embodiments of the present disclosure will be described in detail in conjunction with the accompanying drawings, which makes the technical solutions and other beneficial effects of the present disclosure apparent.

DETAILED DESCRIPTION OF THE EMBODIMENTS

Figure 1:
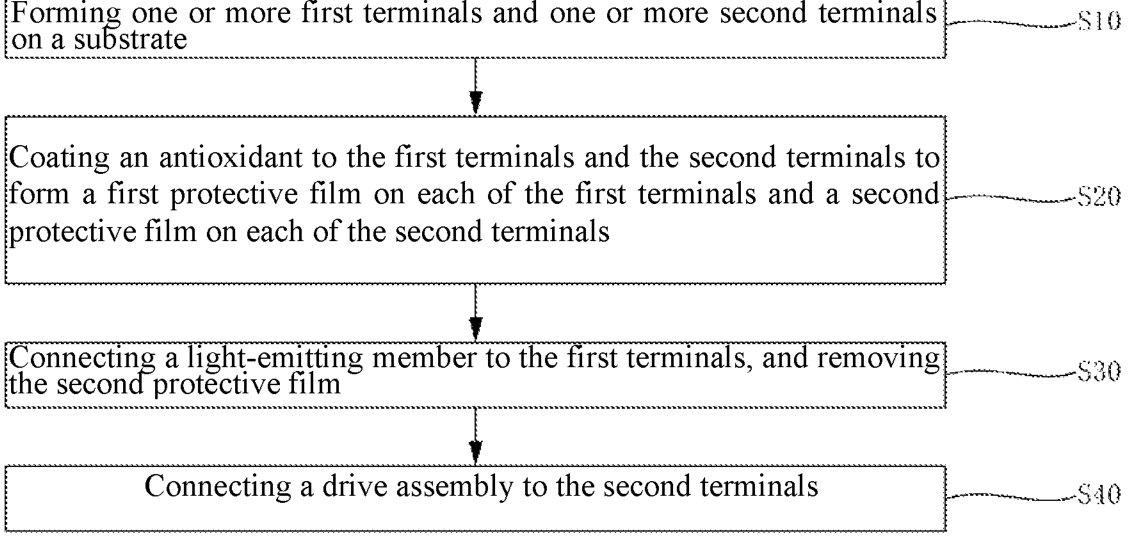
FIG. 1 is a flowchart of a method of manufacturing a backlight module according to some embodiments of the present disclosure.

Embodiments of the present disclosure will be described clearly and fully below in conjunction with the accompanying drawings. It is to be apparent that the described embodiments are only part of the embodiments of the present disclosure and not all of the embodiments. All other embodiments obtained by a person skilled in the art, without involving any inventive effort, based on the embodiments of the present disclosure, are within the scope of the present disclosure.

The following description provides various implementations or examples for realize different structures of the present disclosure. In order to simplify the description of the present disclosure, components and arrangements in specific examples are described below. Certainly, the specific examples are merely illustrative and not intended to limit the present disclosure. In addition, reference numerals and/or reference letters may be repeated in different embodiments of the present disclosure for purposes of simplicity and clarity, and not indicating a relationship between the various embodiments and/or arrangements discussed. In addition, the present disclosure provides examples of various specific processes and materials, but one of ordinary skill in the art may recognize the application of other processes and/or the use of other materials.

Embodiments of the present disclosure provide an antioxidant comprising a film-forming component and a volatilization-suppressing additive. The film-forming component includes at least one of a substituted or unsubstituted acrylic resin, isopropanolamine, and imidazoline. The volatilization-suppressing additive has a boiling point greater than that of the film-forming component.

According to embodiments of the present disclosure, in practice, the antioxidant is provided to comprise a film-forming component and a volatilization-suppressing additive, and the film-forming component includes at least one of a substituted or unsubstituted acrylic resin, isopropanolamine and imidazoline, so that the antioxidant is a volatilizable antioxidant. In addition, the boiling point of the volatilization-suppressing additive is greater than that of the film-forming component, so that the volatilization-suppressing additive can slow the volatilization rate of the antioxidant. In the application process, the antioxidant is coated on a terminal of a backlight module, and may be gradually volatilized in a manufacturing process of the backlight module. Therefore, the oxidation of the terminal may be reduced, and the binding connection of the terminal can be prevented from being affected by the antioxidant.

The embodiments of the present disclosure provide the antioxidant to alleviate a phenomenon of a binding terminal being prone to oxidation in the manufacturing process in the related art. The antioxidant comprises the film-forming component and the volatilization-suppressing additive.

Further, the film-forming component may include at least one of a substituted or unsubstituted acrylic resin, isopropanolamine, and imidazoline. In an embodiment, the boiling point of the film-forming component is less than or equal to 200° C., which can improve the volatility of the antioxidant, so as to allow the antioxidant according to the embodiments of the present disclosure to be a volatilizable oxidant. Therefore, the antioxidant can be volatilized in a high temperature manufacturing process, facilitating removal of the antioxidant in a subsequent process after the antioxidant according to the embodiments of the present disclosure is coated.

Optionally, the boiling point of the film-forming component may be greater than or equal to 100° C. and less than or equal to 200° C., for example, may be 110° C., 120° C., 130° C., 140° C., 150° C., 160° C., 170° C., 180° C., or 190° C.

In an embodiment, the volatilization-suppressing additive may include a lead-containing complex and/or a liquid paraffin wax. The volatilization-suppressing additive can regulate a high temperature-resistance of the antioxidant to slow the volatilization rate of the antioxidant, thereby avoiding rapid removal of the antioxidant after being coated to prevent from ineffective antioxidant effect.

In an embodiment, a mass content of the film-forming component in the antioxidant is 40% to 50%, and a mass content of the volatilization-suppressing additive in the antioxidant is 11% to 19%.

Further, the lead-containing complex may include lead acetate.

It is to be noted that the antioxidant may further include a solvent, and the volatilization-suppressing additive may further include calcium chloride. The solvent may include an alcohol solvent, such as ethanol.

In an embodiment, the antioxidant comprises a substituted or unsubstituted acrylic resin, an ethanol solvent, lead acetate, a liquid paraffin wax, and calcium chloride.

In an embodiment, a mass content of the substituted or unsubstituted acrylic resin in the antioxidant is 40% to 50%, for example may be 40%, 42%, 44%, 46%, 48% or 50%. A mass content of the ethanol solvent in the antioxidant is 35% to 45%, for example may be 35%, 37%, 39%, 41%, 43% or 45%. A content of lead acetate in the antioxidant is 8% to 12%, for example, may be 8%, 9%, 10%, 11% or 12%. A content of the liquid paraffin wax in the antioxidant is 2% to 4%, for example, may be 2%, 3% or 4%. A mass content of calcium chloride in the antioxidant is 1% to 3%, for example, may be 1%, 2% or 3%.

In an embodiment of the present disclosure, there is provided antioxidant components, including a methacrylic resin having a mass content of 45%, ethanol having a mass content of 40%, lead acetate having a mass content of 10%, a liquid paraffin wax having a mass content of 3%, and calcium chloride having a mass content of 2%, and a manufacturing method thereof. Specifically, the above methacrylic resin, lead acetate, liquid paraffin wax, and calcium chloride may be mixed and dissolved in ethanol to obtain a mixture, i.e., the antioxidant.

In another embodiment of the present disclosure, there is provided antioxidant components, including a methacrylic resin having a mass content of 43%, ethanol having a mass content of 42%, lead acetate having a mass content of 10%, a liquid paraffin wax having a mass content of 3%, and calcium chloride having a mass content of 2%, and a manufacturing method thereof. Specifically, the above methacrylic resin, lead acetate, liquid paraffin wax, and calcium chloride may be mixed and dissolved in ethanol to obtain a mixture, i.e., the antioxidant.

In another embodiment of the present disclosure, there is provided antioxidant components, including a methacrylic resin having a mass content of 43%, ethanol having a mass content of 43%, lead acetate having a mass content of 8%, a liquid paraffin wax having a mass content of 3%, and calcium chloride having a mass content of 3%, and a manufacturing method thereof. Specifically, the above methacrylic resin, lead acetate, liquid paraffin wax, and calcium chloride may be mixed and dissolved in ethanol to obtain a mixture, i.e., the antioxidant.

According to embodiments of the present disclosure, the antioxidant is provided to comprise the film-forming component and the volatilization-suppressing additive, and the film-forming component includes at least one of a substituted or unsubstituted acrylic resin, isopropanolamine and imidazoline, so that the antioxidant is a volatilizable antioxidant. In addition, the boiling point of the volatilization-suppressing additive is greater than that of the film-forming component, so that the volatilization-suppressing additive can slow the volatilization rate of the antioxidant. In the application process, a terminal of a backlight module can be coated with the antioxidant, which may be gradually volatilized in the manufacturing process. Therefore, the oxidation of the terminal may be reduced, and the binding connection of the terminal can be prevented from being affected by the antioxidant.

Further, an application process of the antioxidant according to the embodiments of the present disclosure is described below in conjunction with specific examples. The embodiments of the present disclosure further provide a method of manufacturing a backlight module in which the antioxidant described in the above embodiments is needed.

A first terminal and a second terminal are formed on a substrate.

The antioxidant is coated to the first terminal and the second terminal to form a first protective film on the first terminal and a second protective film on the second terminal.

A light-emitting member is connected to the first terminal, and the second protective film is removed.

A drive assembly is connected to the second terminal.

According to an embodiment of the present disclosure, the antioxidant can be coated to the second terminal of the backlight module, and the second protective film formed on the second terminal can be removed in the manufacturing process, for example, by gradually volatilizing. Therefore, the oxidation of the second terminal can be reduced, and the binding connection of the second terminal can be prevented from being affected by the antioxidant.

Figure 2:
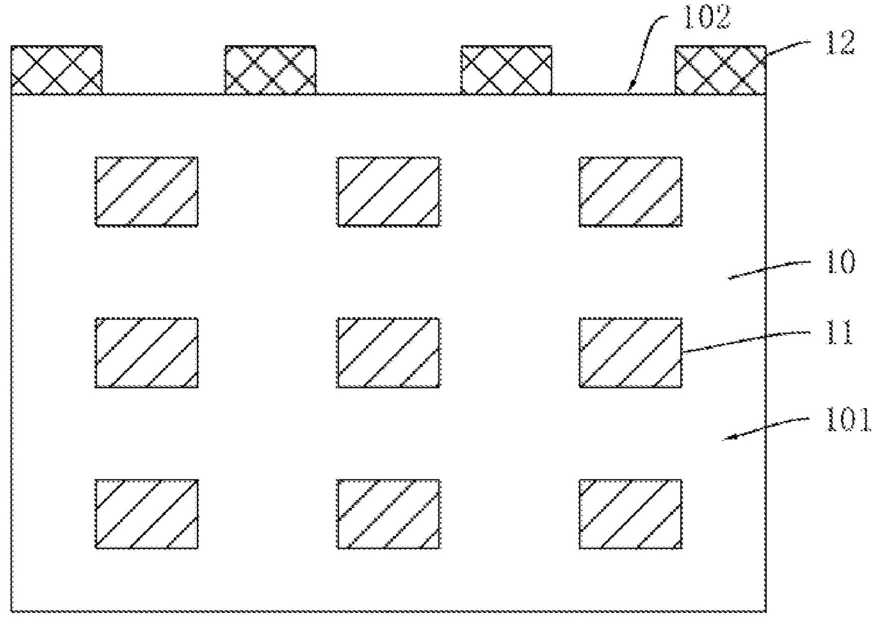
FIG. 2 is a schematic diagram of a first structural of a backlight module according to some embodiments of the present disclosure.
Figure 3:
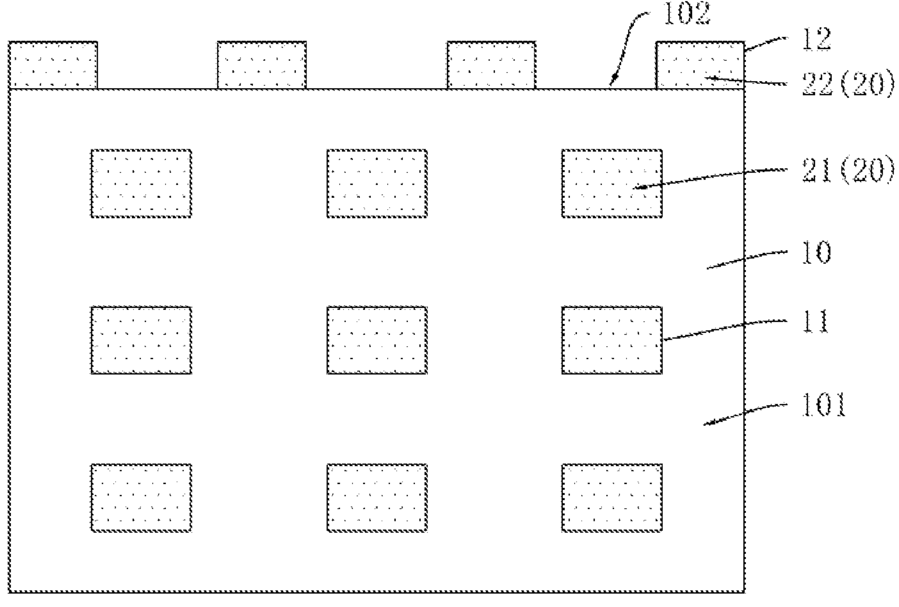
FIG. 3 is a schematic diagram of a second structure of a backlight module according to some embodiments of the present disclosure.

Specifically, referring to FIGS. 1, 2, and 3, the method of manufacturing the backlight module includes the following steps.

S10. A first terminal 11 and a second terminal 12 are formed on a substrate 10.

In step S10, the substrate 10 is first provided. The substrate 10 may be a PCB wiring board or a glass substrate, which is not limited herein. The substrate 10 includes a device mounting surface 101 and a binding side 102 on at least one side of the device mounting surface 101.

The first terminal 11 is formed on the device mounting surface 101 of the substrate 10, and the second terminal 12 is formed on the binding side 102 of the substrate 10. Further, a drive circuit may be formed on the substrate 10, and the drive circuit may connect the first terminal 11 and the second terminal 12 to realize control and transmission of signals.

In an embodiment, the material of the first terminal 11 and the second terminal 12 may include copper or aluminum.

It is to be noted that the first terminal 11 may be configured to connect to the light-emitting member, and the second terminal 12 may be configured to bind the drive assembly.

S20. The antioxidant 20 is coated to the first terminal 11 and the second terminal 12 to form a first protective film 21 on the first terminal 11 and a second protective film 22 on the second terminal 12.

In step S20, the antioxidant 20 according to the above embodiments is coated on the first terminal 11 and the second terminal 12 to form the first protective film 21 on the first terminal 11 and the second protective film 22 on the second terminal 12. The first protective film 21 may cover all exposed surfaces of the first terminal 11, and the second protective film 22 may cover all exposed surfaces of the second terminal 12, so as to act as a barrier to water and oxygen for the first terminal 11 and the second terminal 12, thereby avoiding oxidation of the first terminal 11 and the second terminal 12.

In an embodiment, the antioxidant 20 may be coated on the whole surface of the substrate 10.

Then, a white oil may be coated on the device mounting surface 101 of the substrate 10, and windows may be formed in the white oil to form a plurality of openings. The openings may be provided in one-to-one correspondence with the first terminals 11.

S30. The light-emitting member is connected to the first terminal 11, and the second protective film 22 is removed.

In step S30, a solder paste may be formed on the first terminal 11, and then the light-emitting member may be soldered with the first terminal 11 by the solder paste. It is to be appreciated that during the soldering of the light-emitting member and the first terminal 11, the first protective film 21 on the first terminal 11 may be reacted due to the high temperature to remove the first protective film 21, thereby achieving electrical connection between the first terminal 11 and the light-emitting member. The second protective film 22 is also affected by the high temperature and starts to volatilize. The volatilization process of the second protective film 22 is gradual and slow under the action of the volatilization-suppressing additive, so that the rate of removal of the second protective film 22 is alleviated, and the second terminal 12 may not be oxidized to a large extent during the high temperature process due to premature exposure.

The rate of removal of the second protective film 22 is less than that of the first protective film 21.

Optionally, the light-emitting element may include an LED light, for example a Mini LED light.

In the soldering process of the light-emitting member with the first terminal 11, a reflow soldering process may be used. The reflow soldering process may be performed in three stages.

The first stage is a temperature-raising process for about 5 min. The second stage is a temperature-maintaining process at the melting point of the solder paste for about 2 min. The third stage is a temperature-dropping process for about 3 min;

Since the surface of the second terminal 12 is covered with the second protective film 22, there is no oxidation risk of the second terminal 12 during the temperature-raising process. When the temperature reaches the melting point of the solder paste, the second protective film 22 starts to volatilize, and the volatilization rate of the second protective film 22 is relatively slow due to the presence of the volatilization-suppressing additive, so that the second protective film 22 can still play an anti-oxidation role on the second terminal 12, thereby reducing the degree of oxidation of the second terminal 12. In the temperature-dropping process, the antioxidant 20 is substantially completely volatilized, and the overall temperature is rapidly reduced, so that the oxidation risk of the second terminal 12 is greatly reduced due to the end of the high-temperature process caused by soldering. With respect to the related art, the present disclosure coats the antioxidant 20 on the second terminal 12 for binding to form the second protective film 22, and then removes the second protective film 22 by slowly volatilizing during the soldering process. Both before and during the soldering process, the second protective film 22 can play the anti-oxidation role on the second terminal 12, thereby improving the connection effect of the second terminal 12 in the subsequent binding connection process and the yield thereof.

In an embodiment, the boiling point of the volatilization-suppressing additive is greater than or equal to a first temperature, which is the soldering temperature of the light-emitting member, and may also be considered as the melting point temperature of the solder paste. The first temperature may be greater than or equal to 215° C. and less than or equal to 245° C., the boiling point of the volatilization-suppressing additive may be greater than or equal to 220° C. and less than or equal to 260° C.

It is to be noted that the objective of the present disclosure is to slow down the volatilization rate of the antioxidant during the soldering process by adding the volatilization-suppressing additive into the antioxidant, and thus the volatilization rate of the antioxidant may be controlled by adjusting the components and the content of the volatilization-suppressing additive and adjusting the soldering temperature so as to satisfy the actual requirements.

S40. The drive assembly is connected to the second terminal.

In step S40, since the second protective film 22 has been removed from the surface of the second terminal 12 in step S30, the second terminal 12 is exposed.

Next, the drive assembly may be bound to the second terminal 12. In an embodiment, the drive assembly may include a chip on film and a flexible circuit board. The chip on film is connected between the second terminal 12 and the flexible circuit board to achieve transmission of signals.

In view of the above embodiments of the present disclosure, the antioxidant 20 is provided to comprise the film-forming component and the volatilization-suppressing additive, and the film-forming component includes at least one of a substituted or unsubstituted acrylic resin, isopropanolamine and imidazoline, so that the antioxidant is a volatilizable antioxidant. In addition, the boiling point of the volatilization-suppressing additive is greater than that of the film-forming component, so that the volatilization-suppressing additive can slow the volatilization rate of the antioxidant. In the backlight module provided in the embodiments of the present disclosure, the antioxidant 20 can be coated on both the first terminal 11 and the second terminal 12 to form the first protective film 21 and the second protective film 22, respectively, the first protective film 21 can be directly removed during soldering, and the second protective film 22 can be gradually volatilized and slowly removed in a high-temperature environment, thereby preventing the second terminal 12 from oxidation at a large extent before and after soldering, and removing the second protective film 22 during soldering to expose the second terminal 12, so as to achieve binding connection of the second terminal 12 to the drive assembly, and improve the connection effect and the yield of the backlight module.

In addition, an embodiment of the present disclosure further provides a backlight module. Referring to FIG. 2, the backlight module is manufactured by using the method of manufacturing the backlight module described above.

The backlight module includes the substrate 10, and the first terminal 11 and the second terminal 12 disposed on the substrate 10. The substrate 10 includes the device mounting surface 101 and the binding side 102 on at least one side of the device mounting surface 101. The first terminal 11 is disposed on the device mounting surface 101, and the second terminal 12 is disposed on the binding side 102.

It will be appreciated that the backlight module further includes the drive circuit disposed on the substrate 10, and the drive circuit is connected between the first terminal 11 and the second terminal 12 to realize transmission of signals. The first terminal 11 may be configured to connect the light-emitting member, and the second terminal 12 may be configured to bind the drive assembly.

In an embodiment, the substrate 10 may have a thickness of 0.4 mm, or 0.5 mm, or 0.7 mm.

Since the backlight module according to the embodiments of the present disclosure is manufactured using the antioxidant described above, the first terminal 11 and the second terminal 12 may have antioxidant components remaining on them.

In an embodiment, the surface of the first terminal 11 and/or the second terminal 12 contains at least one of a co-soluble alloy of $Pb^{2+}$, Pb, $Al^{3+}$, $Pb^{2+}$ with a terminal metal, a carboxyl group, and a carbon-carbon double bond, and the materials of the first terminal 11 and the second terminal 12 may include a terminal metal.

Specifically, the acrylic resin in the antioxidant has a large viscosity, and may have a maximum volatility of only about 95% at 220° C. with 5% or more substances remaining. The acrylic resin also has a stable chemical property, and characteristic functional groups may not be structurally destroyed. The characteristic functional group of the acrylic resin is carbon-carbon double bonds and carboxyl groups. In other words, a substance having both a carbon-carbon double bond and a carboxyl group belong to an acrylic resin material. Based on this, the residual acrylic resin on the first terminal 11 and the second terminal 12 can be characterized.

The residual acrylic resin can be determined, for example by a chemical atomic absorption method, an atomic absorption spectrum, or an atomic fluorescence spectroscopy in which the carbon-carbon double bond may generate fluorescence under a specific light source so as to detect the presence of the residual carbon-carbon double bond on the first terminal 11 and/or the second terminal 12, or by an acid-base neutralization titration to detect the presence of the carboxyl group. Therefore, the presence or absence of the carbon-carbon double bond and carboxyl group on the first terminal 11 and/or the second terminal 12 can be detected by the above detection process, so as to prove that the antioxidant used in the backlight module contains the acrylic resin component.

Further, the lead-containing complex generally has a melting point of about 300° C. After the lead-containing complex is decomposed, chemically stable $PbO_2$ may be generated and remains on a pad surface (>10%). In addition, most of $Pb^{2+}$ undergoes a displacement reaction with the metal in the first terminal 11 and the second terminal 12 at a high temperature, and remains in the first terminal 11 and the second terminal 12 to form a stable co-soluble alloy (Pb>50% on the surface of the first terminal 11 and/or the second terminal 12).

In an embodiment, the material of the first terminal 11 and the second terminal 12 may include copper or aluminum. When the material of the first terminal 11 and the second terminal 12 is, for example, copper, the surface of the first terminal 11 and/or the second terminal 12 contains at least one of a co-soluble alloy of $Pb^{2+}$, Pb, $Al^{3+}$, and $Pb^{2+}$ with copper, a carboxyl group, and a carbon-carbon double bond. The material of the first terminal 11 and the material of the second terminal 12 may include a terminal metal.

Since there may be a large amount of stable $Pb^{2+}$ and Pb remaining on the surface after the lead-containing complex is decomposed, if any one of $Pb^{2+}$ and Pb is identified on the surface of the first terminal 11 and/or the second terminal 12, it is proved that the backlight module according to the embodiments of the present disclosure has been treated with a Pb-containing substance. A terminal without anti-oxidation treatment as a blank control group is provided, and then the type and content of Pb element on the surface of the blank terminal may be measured by EDS element analysis, XPS energy spectrum analysis, ICP element content determination, and other testing methods. The type and content of Pb element on the surface of the terminals in test groups are determined by the same testing method as that in the control group. A comparison of the type and content of Pb element between the control group and the test group can prove whether the terminals in the test group are treated with a Pb-containing substance or not.

In view of the above embodiments of the present disclosure, the antioxidant 20 is provided to comprise the film-forming component and the volatilization-suppressing additive, and the film-forming component includes at least one of a substituted or unsubstituted acrylic resin, isopropanolamine and imidazoline, so that the antioxidant is a volatilizable antioxidant. In addition, the boiling point of the volatilization-suppressing additive is greater than that of the film-forming component, so that the volatilization-suppressing additive can slow the volatilization rate of the antioxidant. In the backlight module provided in the embodiments of the present disclosure, the antioxidant 20 can be coated on both the first terminal 11 and the second terminal 12 to form the first protective film 21 and the second protective film 22, respectively, the first protective film 21 can be directly removed during soldering, and the second protective film 22 can be gradually volatilized and slowly removed in a high-temperature environment, thereby preventing the second terminal 12 from oxidation at a large extent before and after soldering, and removing the second protective film 22 during soldering to expose the second terminal 12, so as to achieve binding connection of the second terminal 12 to the drive assembly and improve the connection effect and the yield of the backlight module.

In the above-mentioned embodiments, the description of each embodiment has its own focus, and parts not described in detail in a certain embodiment may be referred to the related description of other embodiments.

The above embodiments of the present disclosure provide a detailed description with regard to the antioxidant, the backlight module and the manufacturing method thereof. Principles and implementations of the present disclosure are described herein using specific examples. The description of the above embodiments is merely intended to assist in understanding the technical solutions of the present disclosure and the core idea thereof. It will be appreciated by those of ordinary skill in the art that modifications may be made to the technical solutions described in the foregoing embodiments, or substitutions may be carried out to some of the technical features therein. These modifications or substitutions do not depart the essence of the corresponding technical solutions from the scope of the technical solutions of the various embodiments of the present disclosure.

What is claimed is:

1. A backlight module, comprising a substrate and one or more first terminals and one or more second terminals formed on the substrate, wherein an antioxidant is coated on the first terminals and the second terminals, and the antioxidant comprises a film-forming component and a volatilization-suppressing additive, the film-forming component comprises at least one of a substituted or unsubstituted acrylic resin, isopropanolamine, and imidazoline, and a boiling point of the volatilization-suppressing additive is greater than that of the film-forming component.

2. The backlight module according to claim 1, wherein the volatilization-suppressing additive comprises a lead-containing complex and/or a liquid paraffin wax.

3. The backlight module according to claim 2, the antioxidant further comprises a solvent, wherein the solvent comprises an alcohol solvent, and the volatilization-suppressing additive further comprises calcium chloride.

4. The backlight module according to claim 1, wherein the boiling point of the film-forming component is less than or equal to 200° C.

5. The backlight module according to claim 1, wherein a mass content of the film-forming component in the antioxidant is 40% to 50%, and a mass content of the volatilization-suppressing additive in the antioxidant is 11% to 19%.

6. The backlight module according to claim 1, wherein a surface of each of the first terminals and/or a surface of each of the second terminals contains at least one of a co-soluble alloy of $Pb^{2+}$, Pb, $Al^{3+}$, $Pb^{2+}$ with a terminal metal, a carboxyl group, and a carbon-carbon double bond, and a material of the first terminals and a material of the second terminals comprise the terminal metal.

7. The backlight module according to claim 1, further comprising a light-emitting member and a drive assembly, wherein the first terminals are electrically connected to the light-emitting member, and the second terminals are bound to the drive assembly.

8. The backlight module according to claim 7, wherein the light-emitting member comprises an LED light member.

* * * * *